United States Patent
Lin et al.

(10) Patent No.: US 9,825,039 B1
(45) Date of Patent: Nov. 21, 2017

(54) SEMICONDUCTOR DEVICE AND FABRICATION METHOD THEREOF

(71) Applicant: United Microelectronics Corp., Hsinchu (TW)

(72) Inventors: Po-Hsieh Lin, Tainan (TW); Yi-Chuen Eng, Tainan (TW); Szu-Hao Lai, Kaohsiung (TW); Ming-Chih Chen, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/296,922

(22) Filed: Oct. 18, 2016

(30) Foreign Application Priority Data

Sep. 9, 2016 (CN) .......................... 2016 1 0812784

(51) Int. Cl.
*H01L 29/66* (2006.01)
*H01L 27/108* (2006.01)
*H01L 29/78* (2006.01)
*H01L 29/10* (2006.01)
*H01L 29/08* (2006.01)
*H01L 21/8234* (2006.01)

(52) U.S. Cl.
CPC .............. *H01L 27/10802* (2013.01); *H01L 21/823431* (2013.01); *H01L 27/10844* (2013.01); *H01L 29/0847* (2013.01); *H01L 29/1037* (2013.01); *H01L 29/66666* (2013.01); *H01L 29/7827* (2013.01); *H01L 29/7841* (2013.01)

(58) Field of Classification Search
CPC .......... H01L 21/8232; H01L 29/66409; H01L 29/7812
See application file for complete search history.

(56) References Cited

U.S. PATENT DOCUMENTS

2010/0291743 A1* 11/2010 Nishi ................ H01L 29/66666
 438/268
2010/0295109 A1 11/2010 Parekh

OTHER PUBLICATIONS

Jyi-Tsong Lin, et al., "Multifunction Behavior of a Vertical MOSFET With Trench Body Structure and New Erase Mechanism for Use in 1T-DRAM" IEEE Transactions on Electron Devices, vol. 61, No. 9, Sep. 2014, pp. 3172-3178.

* cited by examiner

Primary Examiner — Cheung Lee
(74) Attorney, Agent, or Firm — J.C. Patents

(57) ABSTRACT

A semiconductor device and a fabrication method thereof are provided. The semiconductor device includes a semiconductor body, a first doped region, a second doped region, a gate and a dielectric layer. The semiconductor body is disposed on a dielectric substrate and has a protrusion portion, a first portion and a second portion. The first portion and the second portion are respectively disposed at two opposite sides of the protrusion portion. The first doped region is disposed in a top of the protrusion portion. The second doped region is disposed in an end of the first portion far away from the protrusion portion. The gate is disposed on the first portion and adjacent to the protrusion portion. The dielectric layer is disposed between the gate and the protrusion portion, and between the gate and the first portion.

15 Claims, 3 Drawing Sheets

SEMICONDUCTOR DEVICE AND FABRICATION METHOD THEREOF

CROSS-REFERENCE TO RELATED APPLICATION

This application claims the priority benefit of China patent application serial no. 201610812784.7, filed on Sep. 9, 2016. The entirety of the above-mentioned patent application is hereby incorporated by reference herein and made a part of the specification.

BACKGROUND

Field of the Invention

The invention relates to a semiconductor device and a fabrication method thereof and more particularly, to a semiconductor device that can serve as a metal oxide semiconductor field effect transistor (MOSFET) or a dynamic random access memory (DRAM) and a fabrication method thereof.

Description of Related Art

In a general type semiconductor apparatus, a dynamic random access memory (DRAM) and a metal oxide semiconductor field effect transistor (MOSFET) are separately provided for data storage and transmission. However, since the DRAM and the MOSFET are two independent devices, a delay phenomenon commonly occurs to the data transmission. Especially, in the processing of big data, the delay phenomenon causes performance degradation to the semiconductor apparatus. Moreover, due to the DRAM and the MOSFET being two independent devices, a certain level affection also occurs to miniaturization and production cost control of the semiconductor apparatus.

SUMMARY

The invention provides a semiconductor device that can serve as a metal oxide semiconductor field effect transistor (MOSFET) or a dynamic random access memory (DRAM).

The invention further provides a fabrication method of a semiconductor device by which a semiconductor device serving as an MOSFET or a DRAM can be fabricated.

According to an embodiment of the invention, a semiconductor device including a semiconductor body, a first doped region, a second doped region, a gate and a dielectric layer is provided. The semiconductor body is disposed on a dielectric substrate and has a protrusion portion, a first portion and a second portion. The first portion and the second portion are respectively disposed at two opposite sides of the protrusion portion. The first doped region is disposed in a top of the protrusion portion. The second doped region is disposed at an end of the first portion far away from the protrusion portion. The gate is disposed on the first portion and adjacent to the protrusion portion. The dielectric layer is disposed between the gate and the protrusion portion, and between the gate and the first portion.

In the semiconductor device according to an embodiment of the invention, a width of the protrusion portion is, for example, between ¼ and ⅓ of a channel length of the semiconductor device.

According to an embodiment of the invention, a semiconductor device including a first semiconductor structure and a second semiconductor structure disposed on a dielectric substrate and disposed symmetrically to each other is provided. Each of the first semiconductor structure and the second semiconductor structure includes a semiconductor body, a first doped region, a second doped region, a gate and a dielectric layer. The semiconductor body is disposed on the dielectric substrate and has a protrusion portion, a first portion and a second portion. The first portion and the second portion are respectively disposed at two opposite sides of the protrusion portion. The first doped region is disposed in a top of the protrusion portion. The second doped region is disposed at an end of the first portion far away from the protrusion portion. The gate is disposed on the first portion and adjacent to the protrusion portion. The dielectric layer is disposed between the gate and the protrusion portion, and between the gate and the first portion.

In the semiconductor device according to an embodiment of the invention, in each of the first semiconductor structure and the second semiconductor structure, a width of the protrusion portion is, for example, between ¼ and ⅓ of a channel length.

In the semiconductor device according to an embodiment of the invention, a height of a top surface of the first portion is, for example, not more than a height of a top surface of the second portion.

In the semiconductor device according to an embodiment of the invention, a height of a top surface of the gate is, for example, not more than a height of a bottom surface of the first doped region.

In the semiconductor device according to an embodiment of the invention, a height of a top surface of the second portion is, for example, not more than a height of a central portion of the gate.

According to an embodiment of the invention, a fabrication method of a semiconductor device is provided. The fabrication method includes the following steps. A semiconductor layer is formed on a dielectric substrate. A first trench and a second trench are formed in the semiconductor layer, wherein the second trench is located under the first trench, and the second trench exposes a part of the dielectric substrate. A first dielectric layer is formed in the first trench and the second trench. A part of the semiconductor layer at two sides of the first trench is removed to form two semiconductor bodies respectively located at the two sides of the first trench. Each of the semiconductor bodies includes a protrusion portion, a first portion and a second portion, wherein the protrusion portion is adjacent to the first trench, the first portion and the second portion are respectively disposed at two sides of the protrusion portion, and the first portion is far away from the first trench. A second dielectric layer is formed to cover the semiconductor bodies. A conductor layer is forming on the first portion of each of the semiconductor bodies, wherein the conductor layer is adjacent to the protrusion portion. A first doped region is formed in a top of the protrusion portion, and a second doped region is formed in an end of the first portion far away from the protrusion portion.

In the fabrication method according to an embodiment of the invention, a bottom of the first doped region located around a top of the first trench is, for example, not lower than a top surface of the conductor layer.

In the fabrication method according to an embodiment of the invention, a height of a top surface of the first portion is, for example, not more than a height of a top surface of the second portion.

In the fabrication method according to an embodiment of the invention, a width of the protrusion portion is, for example, between ¼ and ⅓ of a channel length of the semiconductor device.

In the fabrication method according to an embodiment of the invention, a height of a top surface of the second portion is, for example, not more than a height of a central portion of the conductor layer.

To sum up, the semiconductor device provided by the embodiments of the invention can serve as an MOSFET or a DRAM according to an operation mode. Thus, the MOSFET or the DRAM does not have to be separately fabricated, which meet the trend of device miniaturization and production cost down.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
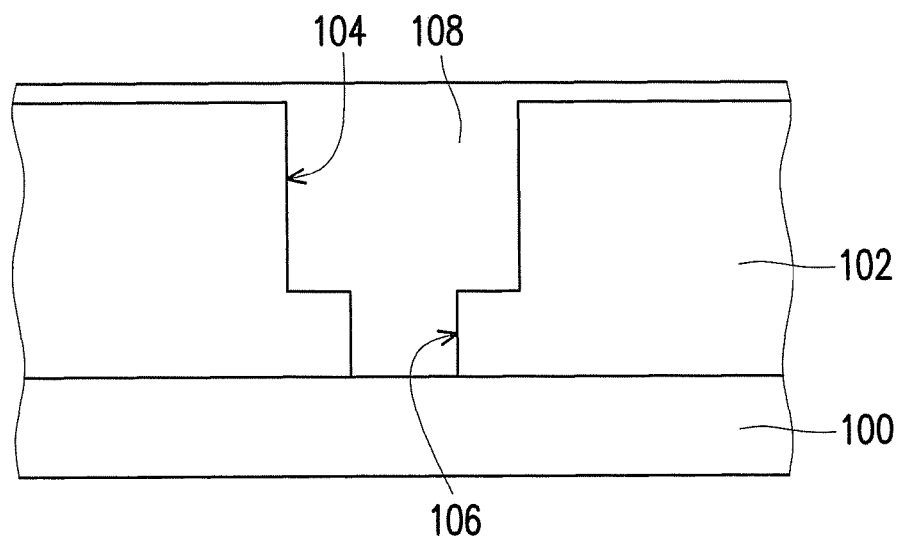
FIGS. 1A through 1E are cross-sectional views schematically illustrating a process for fabricating a semiconductor device according to an embodiment of the invention.

FIGS. 1A through 1E are cross-sectional views schematically illustrating a process for fabricating a semiconductor device according to an embodiment of the invention. First, referring to FIG. 1A, a semiconductor layer 102 is formed on a dielectric substrate 100. The dielectric substrate 100 may be a substrate made of a whole piece of dielectric material, or a dielectric layer formed on a silicon substrate. The semiconductor layer 102 is, for example, a silicon layer, which is formed, for example, by performing a chemical vapor deposition process or an epitaxy process. Then, a trench 104 with a greater width and a trench 106 with a smaller width are formed in the semiconductor layer 102. The trench 104 communicates with the trench 106 thereunder, and the trench 106 exposes a part of the dielectric substrate 100. The trenches 104 and 106 are formed, for example, by performing a generally known dual damascene process.

Then, the trenches 104 and 106 are filled with a dielectric layer 108. In the present embodiment, a part of the dielectric layer 108 is also located on a surface of the semiconductor layer 102. The dielectric layer 108 is formed, for example, by first forming a dielectric material on the semiconductor layer 102 to fill the trenches 104 and 106 and then, performing a planarization process (e.g., a chemical mechanical polishing process).

Figure 1B:
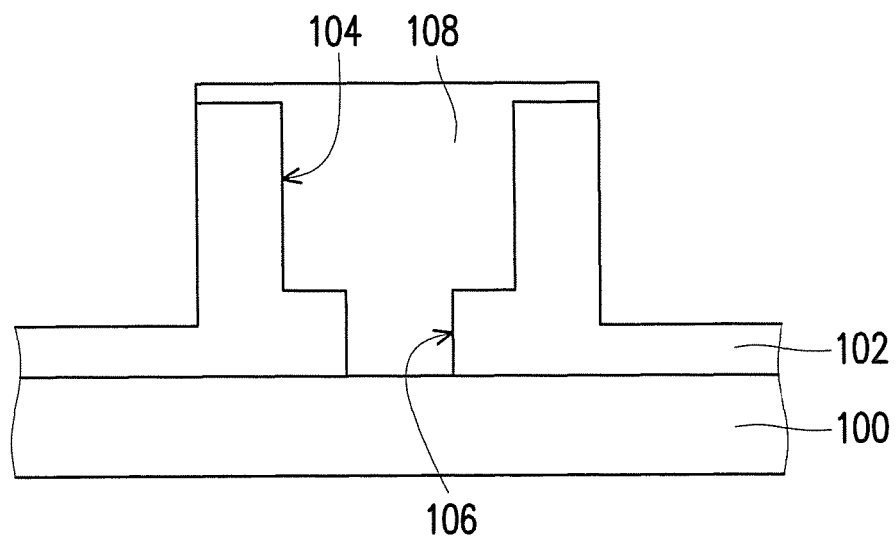

Afterwards, referring to FIG. 1B, a patterning process is performed to remove a part of the dielectric layer 108 and a part of the semiconductor layer 102 respectively located at the left and the right sides of the trench 104. The part of the dielectric layer 108 and the part of the semiconductor layer 102 are removed, for example, by first forming a patterned mask layer (not shown) on the dielectric layer 108. The patterned mask layer covers a part of the dielectric layer 108 which is above and around the trench 104. Then, an anisotropic etching process is performed by using the patterned mask layer as an etching mask to remove the part of the dielectric layer 108 and the part of the semiconductor layer 102. Next, the patterned mask layer is removed. In the present embodiment, after the part of the dielectric layer 108 and the part of the semiconductor layer 102 are removed, a height of the surface of the semiconductor layer 102 under the removed material is lower than a height of the bottom of the trench 104. However, the invention is not limited thereto, as long as the height of the surface of the semiconductor layer 102 under the removed material is not more than the height of the bottom of the trench 104. In another embodiment, the surface of the semiconductor layer 102 under the removed material may be at the same height of the bottom of the trench 104.

Figure 1C:
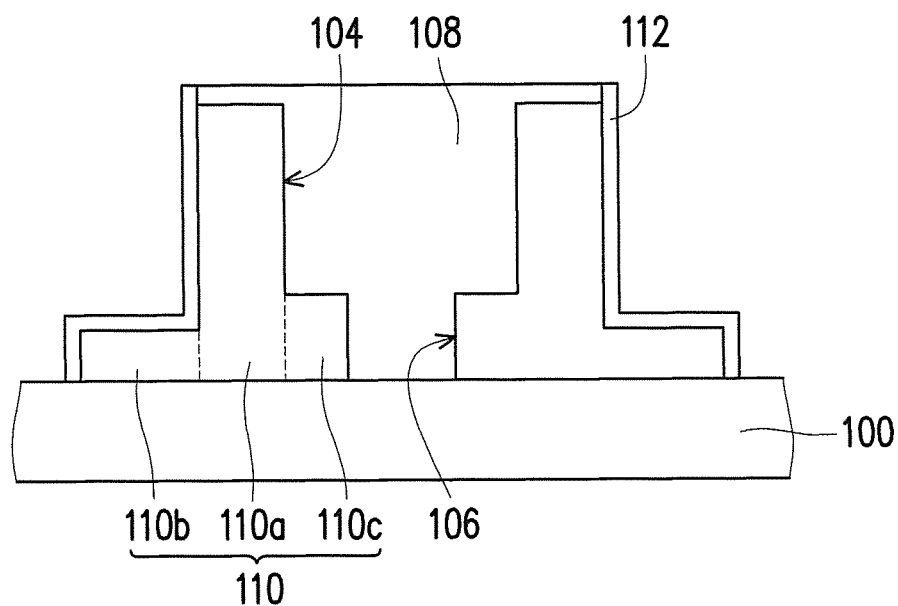

Afterwards, referring to FIG. 1C, another patterning process is performed to remove a part of the semiconductor layer 102 under the removed material to form two semiconductor bodies 110 respectively located at the left and the right sides of the trench 104. Specifically, each of the semiconductor bodies 110 includes a protrusion portion 110a, a first portion 110b and a second portion 110c. The protrusion portion 110a is adjacent to the trench 104, the first portion 110b and the second portion 110c are respectively disposed at two opposite sides of the protrusion portion 110a, and the first portion 110b is far away from the trench 104. As illustrated in FIG. 1C, a part of the protrusion portion 110a forms a side wall of the trench 104. The second portion 110c is located under the trench 104 and forms a side wall of the trench 106. The first portion 110b is opposite to the second portion 110c and far away from the trench 104, and a height of a top surface of the first portion 110b is lower than a height of a top surface of the second portion 110c.

Then, a dielectric layer 112 covering the semiconductor bodies 110 is formed on the dielectric substrate 100. The dielectric layer 112 is formed, for example, by performing a thermal oxidation process to grow an oxide layer on each of the semiconductor bodies 110.

Figure 1D:
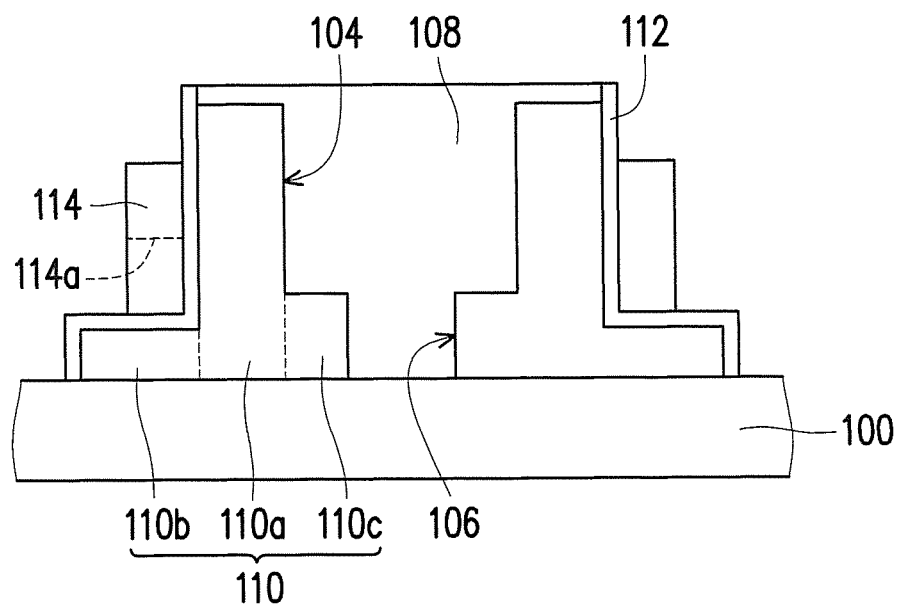

Next, referring to FIG. 1D, a conductor layer 114 is formed on the first portion 110b of each of the semiconductor bodies 110. The conductor layer 114 is adjacent to the protrusion portion 110a, i.e., the conductor layer 140 is located on the side wall of the protrusion portion 110a, and the dielectric layer 112 is located between the conductor layer 114 and the protrusion portion 110a. The conductor layer 114 is formed, for example, by first forming a conductive material layer covering the dielectric layer 108 and the dielectric layer 112 over the dielectric layer 100 and then, performing a patterning process. The aforementioned conductive material layer is, for example, a polysilicon layer. In the aforementioned patterning process, a height of a top surface of the conductor layer 114 may be controlled based on the height of the top surface of the second portion 110c, such that a height of a central portion 114a of conductor layer 114 is higher than the height of the top surface of the second portion 110c. However, the invention is not limited thereto, as long as the height of the top surface of the second portion 110c is not more than the height of the central portion 114a of the conductor layer 114. In another embodiment, the top surface of the second portion 110c may be at the same height of the central portion 114a of the conductor layer 114.

Figure 1E:
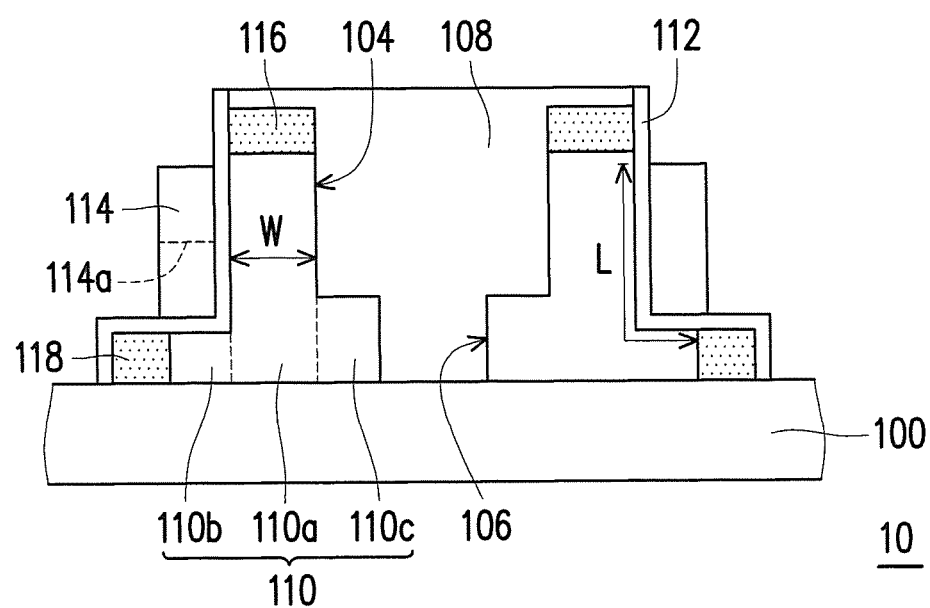

Next, referring to FIG. 1E, an ion implantation process is performed to form a doped region 116 in the top of the protrusion portion 110a (i.e., the protrusion portion 110a around the top of the trench 104) and a doped region 118 in an end of the first portion 110b far away from the protrusion portion 110a. During the ion implantation process, the conductor layer 114 is also doped simultaneously. In the present embodiment, a bottom of the doped region 116 is higher than the top surface of the conductor layer 114. However, the invention is not limited thereto, as long as the bottom of the doped region 116 is not lower than the top surface of the conductor layer 114. In another embodiment, the bottom of the doped region 116 is at the same height of the top surface of the conductor layer 114. In this way, the fabrication of the semiconductor device 10 of the present embodiment is completed. Certainly, normal follow-up processes may be continuously performed. For example, a dielectric layer covering the semiconductor device 10 may be formed over the dielectric substrate 100, and then, contact vias connected with the conductor layer 114, the doped region 116 and the doped region 118 may be formed in the dielectric layer.

Hereinafter, the semiconductor device 10 illustrated in FIG. 1E is taken as an example for describing the semiconductor device of the invention that can serve as an MOSFET or a DRAM.

The semiconductor device 10 includes two sub-semiconductor devices which are disposed symmetrically to each other and respectively located at the left and the right of the trenches 104 and 106. Each of the sub-semiconductor devices includes a semiconductor body 110, a conductor layer 114 serving as a gate, a doped region 116, a doped region 118 and a dielectric layer 112 serving as a gate dielectric layer. It is to be specially mentioned that in the two sub-semiconductor devices, corresponding elements have the same materials and disposition manners. However, sizes of the corresponding elements may be different due to adjustment depending on the actual fabrication process. For example, the top surfaces of the gates (i.e., the conductor layers 114) in the two sub-semiconductor devices may be different. Additionally, the heights of the bottom surfaces of the doped regions 116 in the two sub-semiconductor devices may be different. In the invention, the difference in the sizes of the corresponding elements in the two sub-semiconductor devices is not limited to the above description.

In each sub-semiconductor device, the height of the top surface of the first portion 110b is not more than the height of the top surface of the second portion 110c, which may be controlled by the fabrication steps illustrated in FIGS. 1A and 1B. Additionally, the height of the top surface of the gate is not more than the height of the bottom surface of the doped region 116, which may be controlled by the fabrication steps illustrated in FIGS. 1D and 1E. Additionally, the height of the top surface of the second portion 110c is not more than the height of the central portion 114a of the gate, which may be controlled by the fabrication steps illustrated in FIGS. 1A and 1D.

Hereinafter, the sub-semiconductor device at the left side in FIG. 1E is taken as an example for further description.

The sub-semiconductor device can serve as an MOSFET or a DRAM according to an operation mode. In an operation mode, a gate voltage is applied to the gate, the doped region 118 serves as a source and is grounded, and the doped region 116 serves as a drain and is applied with a drain voltage. In this way, a great amount of charge is aggregated in the second portion 110c. In this circumstance, the sub-semiconductor device is a DRAM, and the operation is a programming operation of the DRAM. Namely, in a scenario that the sub-semiconductor device is the DRAM, the second portion 110c is used for storing data. Thus, the height of the top surface of the second portion 110c being not more than the height of the central portion 114a of the gate can effectively prevent the stored charge from loss due to being close to the drain (i.e., the doped region 116).

In another operation mode, a gate voltage is applied to the gate, the doped region 116 serves as a source and is grounded, and the doped region 118 serves as a drain and is applied with a drain voltage. In this way, only a very small amount or none of the charge is in the second portion 110c. In this circumstance, the sub-semiconductor device is an MOSFET. Namely, in a scenario that the sub-semiconductor device is the MOSFET, the second portion 110c is used for reducing channel resistance, instead of storing data. Thus, the height of the top surface of the second portion 110c being not more than the height of the central portion 114a of the gate can effectively prevent the charge from aggregating in the second portion 110c.

Additionally, in the sub-semiconductor device, a width W of the protrusion portion 110a is between ¼ and ⅓ of a channel length L of the sub-semiconductor device. In this way, the performance of the sub-semiconductor device can be effectively enhanced. The width W of the protrusion portion 110a and the channel length L of the sub-semiconductor device (i.e., a length of an overlapping area of the gate and the protrusion portion 110a and the first portion 110b) may be controlled by the fabrication steps illustrated in FIGS. 1A and 1D.

It is to be specially mentioned that the two sub-semiconductor devices in the semiconductor device 10 may be considered as two independent devices, and thus, different operations may be respectively performed thereon. Namely, the two sub-semiconductor devices can individually serve as an MOSFET or a DRAM according to demands. In this way, each of the sub-semiconductor devices may be modulated as an MOSFET or a DRAM in different scenarios, which meets the trend of device miniaturization and production cost down.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A semiconductor device, comprising:
   a semiconductor body, disposed on a dielectric substrate and has a protrusion portion, a first portion and a second portion, wherein the first portion and the second portion are respectively disposed at two opposite sides of the protrusion portion, and the second portion is undoped;
   a first doped region, disposed in a top of the protrusion portion;
   a second doped region, disposed in an end of the first portion far away from the protrusion portion;
   a gate, disposed on the first portion and adjacent to the protrusion portion; and
   a dielectric layer, disposed between the gate and the protrusion portion, and between the gate and the first portion.

2. The semiconductor device as claimed in claim 1, wherein a height of a top surface of the first portion is not more than a height of a top surface of the second portion.

3. The semiconductor device as claimed in claim 1, wherein a height of a top surface of the gate is not more than a height of a bottom surface of the first doped region.

4. The semiconductor device as claimed in claim 1, wherein a width of the protrusion portion is between ¼ and ⅓ of a channel length of the semiconductor device.

5. The semiconductor device as claimed in claim 1, wherein a height of a top surface of the second portion is not more than a height of a central portion of the gate.

6. A semiconductor device, comprising:
   a first semiconductor structure, disposed on a dielectric substrate; and
   a second semiconductor structure, disposed on the dielectric substrate and disposed symmetrically to the first semiconductor structure,
   wherein each of the first semiconductor structure and the second semiconductor structure comprises:
   a semiconductor body, disposed on the dielectric substrate and has a protrusion portion, a first portion and a second portion, wherein the first portion and the second portion are respectively disposed at two opposite sides of the protrusion portion, and the second portion is undoped;
   a first doped region, disposed in a top of the protrusion portion;
   a second doped region, disposed at an end of the first portion far away from the protrusion portion;
   a gate, disposed on the first portion and adjacent to the protrusion portion; and
   a dielectric layer, disposed between the gate and the protrusion portion, and between the gate and the first portion.

7. The semiconductor device as claimed in claim 6, wherein a height of a top surface of the first portion is not more than a height of a top surface of the second portion.

8. The semiconductor device as claimed in claim 6, wherein a height of a top surface of the gate is not more than a height of a bottom surface of the first doped region.

9. The semiconductor device as claimed in claim 6, wherein in each of the first semiconductor structure and the second semiconductor structure, a width of the protrusion portion is between ¼ and ⅓ of a channel length.

10. The semiconductor device as claimed in claim 6, wherein a height of a top surface of the second portion is not more than a height of a central portion of the gate.

11. A fabrication method of a semiconductor device, comprising:
   forming a semiconductor layer on a dielectric substrate;
   forming a first trench and a second trench in the semiconductor layer, wherein the second trench is located under the first trench, and the second trench exposes a part of the dielectric substrate;
   forming a first dielectric layer in the first trench and the second trench;
   removing a part of the semiconductor layer at two sides of the first dielectric layer to form two semiconductor bodies respectively located at the two sides of the first trench, and each of the semiconductor bodies comprising a protrusion portion, a first portion and a second portion, wherein the protrusion portion is adjacent to the first trench, the first portion and the second portion are respectively disposed at two sides of the protrusion portion, and the first portion is far away from the first trench;
   forming a second dielectric layer to cover the semiconductor bodies;
   forming a conductor layer on the second dielectric layer on the first portion and a sidewall of the protrusion portion of each of the semiconductor bodies; and
   forming a first doped region in a top of the protrusion portion and forming a second doped region in an end of the first portion far away from the protrusion portion.

12. The fabrication method as claimed in claim 11, wherein a bottom of the first doped region located around a top of the first trench is not lower than a top surface of the conductor layer.

13. The fabrication method as claimed in claim 11, wherein a height of a top surface of the first portion is not more than a height of a top surface of the second portion.

14. The fabrication method as claimed in claim 11, wherein a width of the protrusion portion is between ¼ and ⅓ of a channel length of the semiconductor device.

15. The fabrication method as claimed in claim 11, wherein a height of a top surface of the second portion is not more than a height of a central portion of the conductor layer.

* * * * *